(12) United States Patent
Van Beek et al.

(10) Patent No.: US 7,554,425 B2
(45) Date of Patent: Jun. 30, 2009

(54) ELECTROMECHANICAL TRANSDUCER AND ELECTRICAL DEVICE

(75) Inventors: Jozef Thomas Martinus Van Beek, Eindhoven (NL); Peter Gerard Steeneken, Eindhoven (NL)

(73) Assignee: NXP B.V., Eindhoven (NL)

( * ) Notice: Subject to any disclaimer, the term of this patent is extended or adjusted under 35 U.S.C. 154(b) by 153 days.

(21) Appl. No.: 10/570,435

(22) PCT Filed: Aug. 23, 2004

(86) PCT No.: PCT/IB2004/051524

§ 371 (c)(1),
(2), (4) Date: Apr. 10, 2007

(87) PCT Pub. No.: WO2005/025057

PCT Pub. Date: Mar. 17, 2005

(65) Prior Publication Data

US 2007/0262831 A1    Nov. 15, 2007

(30) Foreign Application Priority Data

Sep. 10, 2003  (EP) ............................ 03103341
Mar. 9, 2004   (EP) ............................ 04100951

(51) Int. Cl.
*H03H 9/02*  (2006.01)
*H03H 9/46*  (2006.01)
*H03H 3/013* (2006.01)

(52) U.S. Cl. ........................ 333/186; 333/197
(58) Field of Classification Search .............. 333/188
See application file for complete search history.

(56) References Cited

U.S. PATENT DOCUMENTS

| 6,236,281 | B1 * | 5/2001 | Nguyen et al. | 331/154 |
| 7,068,125 | B2 * | 6/2006 | Lutz et al. | 333/186 |
| 7,102,467 | B2 * | 9/2006 | Lutz et al. | 333/186 |

\* cited by examiner

*Primary Examiner*—Robert Pascal
*Assistant Examiner*—Alan Wong (57) ABSTRACT

The electromechanical transducer (1) has a resonator element (20) and an actuator (30) for inducing an elastic deformation of the resonator element (20) dependent on the electrical input signal. For temperature stabilization, the electromechanical transducer (1) has a sensing element (40) for providing an electrical sensing signal has a function of a temperature of the resonator element (20), and a heating element (50) for heating the resonator element to reduce the temperature dependent frequency deviation to keep the resonance frequency equal to the nominal frequency at operating temperature. The heating element (50) is controlled by an electrical heating signal based on the electrical sensing signal. The resonator element may have the hating element or the sensing element; it may be part of a wheatstone bridge; it may consist of two longitudinally extendable parts (201, 202) extending in opposite directions, being attached in a support area (204) in a deformation free part (203).

23 Claims, 8 Drawing Sheets

ELECTROMECHANICAL TRANSDUCER AND ELECTRICAL DEVICE

The invention relates to an electromechanical transducer for transducing an electrical input signal into an electrical output signal.

The invention relates further to an electronic device comprising such an electromechanical transducer.

Electromechanical transducers as described in the opening paragraph are known in the art. An example of such an electromechanical transducer is a micro electro-mechanical system (MEMS) device, specifically a narrow band-pass filter (high Q filter). The filter uses the natural vibrational frequency of a micro-resonator to transmit signals at precise frequencies while attenuating signals and noise at other frequencies. The filter device comprises a semiconductive resonator and a conductive input structure to which an alternating electrical signal is supplied. The alternating electrical signal causes the formation of an image charge on the semiconductive resonator thereby attracting the resonator towards the conductive input structure. If the alternating signal frequency is similar to the natural mechanical vibrational frequency, the resonator vibrates, enhancing the image charge and the transmitted AC signal. The meshing of the electrical and the mechanical vibrations selectively isolates and transmits desired frequencies.

It is a disadvantage of the known electromechanical transducer that the transmittance changes when the temperature of the surroundings of the electromechanical transducer changes. This is in particular disadvantageous when the electromechanical transducer is used as a filter or as an oscillator. It may happen, e.g., that the oscillator comprising the electromechanical transducer generates a signal at a frequency which is different from the frequency it is to generate at the operating temperature which may result in a malfunction of an electric device controlled by the oscillator. When the electromechanical transducer is used as a filter, a temperature induced change of the transmittance may result in that a signal to be transmitted by the filter is not transmitted by the filter but blocked leading to a malfunction of an electric device comprising the filter.

It is an object of the invention to provide an electromechanical transducer, which has a transmittance which is less sensitive to temperature changes of the surroundings of the electromechanical transducer.

The invention is defined by the independent claims. The dependent claims define advantageous embodiments.

The electromechanical transducer according to the invention comprises a sensing element for providing an electrical sensing signal which is a function of the temperature of the resonator element. The sensing element is used analogous to an electric thermometer which effectively measures the temperature of the resonator element. The electromechanical transducer according to the invention further comprises a heating element for heating the resonator element for reducing the frequency deviation to keep the resonance frequency substantially equal to the nominal frequency. To this end the heating element is controlled by an electrical heating signal derived from the electrical sensing signal. In this way a change of the resonance frequency due to a temperature change of the surroundings of the electromechanical transducer, which changes the transmittance of the electromechanical transducer, is counteracted.

Due to mechanical losses the resonator element does not have a single sharp resonance frequency but rather a resonance frequency band. The width of the resonance frequency band is inversely proportional to the quality factor Q of the resonator. According to the invention the resonance frequency is substantially equal to the nominal frequency when the nominal frequency is inside the resonance frequency band.

The actuator means may comprise an electrostatic actuator, alternatively or in addition the actuator means may comprise a piezoelectric actuator as described, e.g., in U.S. Pat. No. 3,634,787. The electrical output signal, which is a function of the elastic deformation, may depend on the position and/or the velocity of the resonator element.

From U.S. Pat. No. B1-6,238,946 it is known that the natural frequency of a MEMS device may be tuned by heating the resonator. This is accomplished by fabrication of a pad which functions to enable a current to be sent through the resonator to another pad and consequently heat up the resonator.

It is advantageous if the heating element comprises a heating resistor because this allows for relatively simple and effective controlling of the heating element by the electrical heating signal. For an ohmic resistor the Joule heating is proportional to the current through the heating element. It is then particularly advantageous if the heating resistor comprises at least a part of the resonator element because the resonator element is heated effectively. Preferably, the heating resistor comprises the entire resonator element because the resonator element is then heated even more effectively.

In an embodiment the sensing element comprises a sensing resistor having a sensing resistance including a nominal sensing resistance ($R_S$) at the operating temperature ($T_O$) and a temperature dependent sensing resistance deviation ($dR_S(T-T_O)$) from the nominal sensing resistance, the electrical sensing signal being a function of the sensing resistance. In this embodiment sensing the temperature of the resonator element comprises monitoring the temperature dependent change of the resistivity of the sensing resistor. In this case the sensing element has a relatively simple structure and it is relatively easy to generate the electrical sensing signal. One particularly easy way to generate the electrical sensing signal is to measure a voltage drop over the sensing resistor.

It is further advantageous if the sensing resistor comprises at least a part of the resonator element because the temperature of the resonator element is measured directly, i.e. the temperature of other elements of, e.g., the electromechanical transducer have a limited, preferably no influence on the electrical sensing signal. An additional advantage is that the electromechanical transducer can be build relatively compact. In one embodiment the sensing resistor comprises the entire resonator element.

In an embodiment the sensing element comprises the heating element and/or the heating element comprises the sensing element. At least partly integrating the heating element and the sensing element in the same electrical device results in a simple and compact electromechanical transducer. Preferably, these two elements are completely integrated in one electrical device. Preferably, these two elements are completely integrated in the resonator element because this allows for both a precise temperature measurement and effective heating. In one embodiment the heating element and the sensing element comprise the same resistor which is preferably formed by the resonator element.

For an effective temperature stabilization it is preferred that the operating temperature is higher than the temperature of the surroundings. When the electromechanical transducer is used in conjunction with other electric devices which have a device specific operating temperature, it is therefore advantageous if the operating temperature of the electromechanical transducer is higher than the device specific operating temperature. Preferably, the difference between the operating temperature of the electromechanical transducer and the device specific operating temperature is at least 10 K because this results in a relative robust temperature stabilization. To limit the power consumption required for heating it is often advantageous if this difference is lower than 100 K.

In an embodiment allowing for a relatively precise and easy temperature stabilized transmittance, the sensing resistor is included in a Wheatstone type of electric circuit, the Wheatstone type of electric circuit comprises a first contact area and a second contact area, the first contact area being electrically connected to the second contact area via a first connection and via a second connection arranged parallel to the first connection, the first connection comprising the sensing resistor in series with a first resistor, the second connection comprising a reference resistor in series with a second resistor, the sensing resistor and the first resistor being connected by a first electrical connector, the reference resistor and the second resistor being connected by a second electrical connector, the electrical sensing signal comprising a potential difference between the first connector and the second connector.

It is preferred that the reference resistor has a reference resistance including a nominal reference resistance ($R_R$) at the operating temperature ($T_O$) and a temperature dependent reference resistance deviation ($dR_R(T-T_O)$) from the nominal reference resistance, a relative temperature dependent reference resistance deviation being smaller than a relative temperature dependent sensing resistance deviation ($dR_R(T-T_O)/R_R < dR_S(T-T_O)/R_S$). This allows for a relatively easy construction of the first resistor and the second resistor. If this condition is not met the temperature dependence of the first resistor and the second resistor have to be adjusted to be able to generate the electrical sensing signal and a relatively complex circuit is required for generating the heating signal.

The relative temperature coefficient of the reference resistor $TCR_R = dR_R/(R_R \cdot dT)$ should be preferably low enough to allow for a relatively easy temperature stabilization. The preferred maximum value of $TCR_R$ depends in general on the relative temperature coefficient of the sensing resistor $TCR_S = dR_S/(R_S \cdot dT)$ and the required stability of the resonator element, i.e. the maximum allowable temperature change of the resonator element. If $TCR_S$ increases, $TCR_R$ may increase as well. If the maximum allowable temperature change of the resonator element increases, $TCR_R$ may increase as well.

Preferably, the temperature dependent reference resistance deviation is as low as possible. The reference resistor may be composed of a first element having a positive temperature dependence, i.e. dR/dT is positive, and a second element having a negative temperature dependence, i.e. dR/dT is negative. The temperature dependent reference resistance deviation of the first element and of the second element partly compensate each other which results in a reduced temperature dependent reference resistance deviation of the reference resistor. Alternatively, the reference resistor may be composed of a material which intrinsically has a relatively small TCR thereby satisfying the above-mentioned condition for the preferred value of $TCR_R$.

It is also preferred if the first resistor has a first resistance including a nominal first resistance ($R_1$) at the operating temperature ($T_O$) and a temperature dependent first resistance deviation ($dR_1(T-T_O)$) from the nominal first resistance, the second resistor has a second resistance including a nominal second resistance ($R_2$) at the operating temperature ($T_O$) and a temperature dependent second resistance deviation ($dR_2(T-T_O)$) from the nominal second resistance, a relative temperature dependent first resistance deviation being substantially equal to a relative temperature dependent second resistance deviation ($dR_1(T-T_O)/R_1 = dR_2(T-T_O)/R_2$). In this embodiment temperature dependent resistance changes of the first resistor and the second resistor do not influence the potential difference.

If this condition is not met the temperature dependence of the reference resistor and the sensing resistor have to be adjusted to be able to generate the electrical sensing signal and a relatively complex circuit is required for generating the heating signal. Preferably, the temperature dependent reference resistance deviation is as low as possible. The first resistor and/or the second resistor may be composed of a first element having a positive temperature dependence, i.e. dR/dT is positive, and a second element having a negative temperature dependence, i.e. dR/dT is negative. The temperature dependent reference resistance deviation of the first element and of the second element partly compensate each other which results in a reduced temperature dependent reference resistance deviation of the first resistor and/or the second resistor, respectively.

If the sensing resistor is situated between the first contact area and the first connector, and the reference resistor is situated between the first contact area and the second connector, at the operating temperature the reference resistor having a nominal reference resistance ($R_R$), the first resistor having a nominal first resistance ($R_1$), the second resistor having a nominal second resistance ($R_2$), the ratio of the nominal sensing resistance over the nominal first resistance being equal to the ratio of the nominal reference resistance over the nominal second resistance times a scaling factor (c), the scaling factor (c) being substantially equal to 1 ($R_S/R_1 = c\,R_R/R_2, c \approx 1$). In this case the potential difference is substantially zero when the sensing element is at the operating temperature which allows for a relatively easy way to control the electronic heating signal. The heating signal may be, e.g. be proportional to the potential difference.

When the scaling factor is not exactly equal to 1, the electromechanical transducer is stabilized at a temperature slightly different than the operating temperature. As a consequence the resonance frequency of the resonator element is stabilized at a value slightly different from the nominal frequency. Depending on the application of the electromechanical transducer the nominal frequency has to be met within an application specific tolerance range. The tolerance range corresponds to a temperature range around the operating temperature in which the actual temperature must be in order to have an actual frequency within the application specific tolerance range. The word "substantially" here implies that the deviation of the scaling parameter from 1 are so small that the temperature lies indeed within this temperature range.

In an embodiment the heating element comprises, preferably constitutes, a heating resistor, the sensing resistor constituting the heating resistor, the second contact area being electrically connected to a ground potential, the first contact area being electrically connected to an electrical energy source for providing the electrical heating signal. In this way the sensing element and the heating element are integrated in one circuit and the control of the electric heating signal is achieved in a relatively easy way.

It is then advantageous if the nominal reference resistance is larger than the nominal sensing resistance ($R_R > R_S$) because then the electrical current mainly flows through the sensing resistor which is constituting the heating resistor. The current through the reference resistor is relatively small. As a result the power dissipation in the reference resistor is relatively low, which leads to a relatively low overall power consumption.

In an embodiment of the transducer the resonator element is constituted by a first part having a first length in the longitudinal direction and a second part having a second length in the longitudinal direction, the elastic deformation comprising a change of the first length which is counteracted by a first elastic force, and a change of the second length which is counteracted by a second elastic force, the first elastic force and the second elastic force substantially compensating each other in a deformation free part of the resonator element, the resonator element being attached to the substrate in a support area comprised in the deformation free part.

In such a transducer the amount of mechanical energy flowing from the resonator element via the support area into the substrate, i.e. the energy loss is relatively low because the resonator element is attached to the substrate in a support area which is substantially free of deformations. Therefore, this transducer has a relatively large Q factor and correspondingly a relatively large output signal at a relatively well defined frequency.

It is often advantageous if the resonator element is substantially mirror symmetric with respect to an imaginary plane perpendicular to the longitudinal direction and comprised in the deformation free part. In this case it is possible to use a mirror symmetric actuator to induce a deformation such that the first elastic force and the second elastic force substantially compensate each other in the deformation free part.

It is also advantageous if the resonator element has a width in a width direction perpendicular to the longitudinal direction, the length being larger than the width. It is further advantageous if the first resonator element has a height in a height direction perpendicular to the longitudinal direction and to the width direction, the length being larger than the height. The larger the length with respect to the width and the height, the better defined is the eigenmode of the resonator element in which the first length and the second length vary while the other dimensions are unchanged. It is then relatively easy to excite the resonator element in this eigenmode without at the same time exciting other eigenmodes involving the variation of other parameters of the resonator element.

In a variation of the embodiment described above, the support area comprises a first resonator contact and a second resonator contact that is electrically connected to the first resonator contact by a conductive path comprised in the resonator element, the conductive path comprising a point outside the deformation free part.

In such a transducer the resonator element constituting the resistor can be contacted conveniently because it is then not necessary to electrically contact the resonator element in an area outside the deformation free part for obtaining a resistance which is a function of the variation of the length. This yields a relatively simple transducer. Moreover, the heating of the resonator element outside the deformation free part may be more effective in such a transducer. The current path may be employed to heat the resonator element resistively outside the support area. In addition the temperature of the resonator element outside the support area may be effectively measured using the resistance of the current path.

It is particularly advantageous if the resonator element has an outer end in the longitudinal direction, the point being at the outer end. In such a transducer the conductive path has a component in the longitudinal direction which is substantially equal to or even larger than the first length or the second length, respectively. Therefore, the change of the first length or the second length, respectively, leads to a relatively large change in the length of the conductive path and thus to a relatively large signal. It is advantageous if the resonator element has a further outer end in the longitudinal direction, the conductive path comprising the point and a further point which is at the further outer end in that order. In this transducer the change of the first length and the second length leads to an even larger change in the length of the conductive path and thus to an even larger signal.

In an embodiment the resonator element comprises a first material with a first electric conductivity constituting the conductive path and a second material with a second electric conductivity which is smaller than the first electric conductivity, every path from the first resonator contact to the second resonator contact which is free from the point comprising the second material.

The resistance of the resonator element is due to all paths connecting the first resonator contact to the second resonator contact. The resistance of a particular path in relation to the resistances of all other paths determines how much this particular path contributes to the total resistance: a path with a relatively small resistance contributes to a relatively large extend to the total resistance whereas a path with a relatively large resistance contributes to a relatively small extend to the total resistance. By using a second material with a relatively low conductivity, the resistances of the paths which do not comprise the point is increased resulting in a relatively small contribution to the total resistance. These paths which do not comprise the point comprise amongst others those paths which are entirely enclosed in the deformation free part and therefore do not lead to a resistance which is a function of the deformation. By using the second material, the contribution of the latter paths is reduced and the sensitivity of the transducer is increased.

The lower the conductivity of the second material, the smaller the contribution of the paths which do not comprise the point outside the deformation free part. It is therefore particularly advantageous if the second material comprises a dielectric material. Preferably, the second material consists of a dielectric material such as, e.g., silicon dioxide or any other dielectric used in semiconductor device manufacturing. Alternatively, the second material may comprise a gaseous material or vacuum. Such materials have good isolating properties and are easy to include in the resonator element.

The first material may comprise any material which has a conductivity which depends on its deformation. It may comprise all types of metals such as, e.g., copper, aluminum or tungsten. Favorable results are obtained with silicon and other semiconducting materials because these materials have a resistivity which varies relatively strongly as function of the change of the length.

The electromechanical transducer according to the invention is advantageously used in an electrical device for receiving and/or transmitting an electrical information signal, wherein the electrical information signal is a function of the electrical input signal and/or the electrical output signal. Such an electrical device may be, e.g., a mobile phone or a base station for a mobile phone. Alternatively, the electrical device may be any other electrical device making use of wireless transmission of an electric signal. The electromechanical transducer is suited as, e.g., an oscillator or a filter.

These and other aspects of the electromechanical transducer according to the invention will be further elucidated and described with reference to the drawings, in which.

The Figures are not drawn to scale. In general, identical components are denoted by the same reference numerals.

Figure 1:
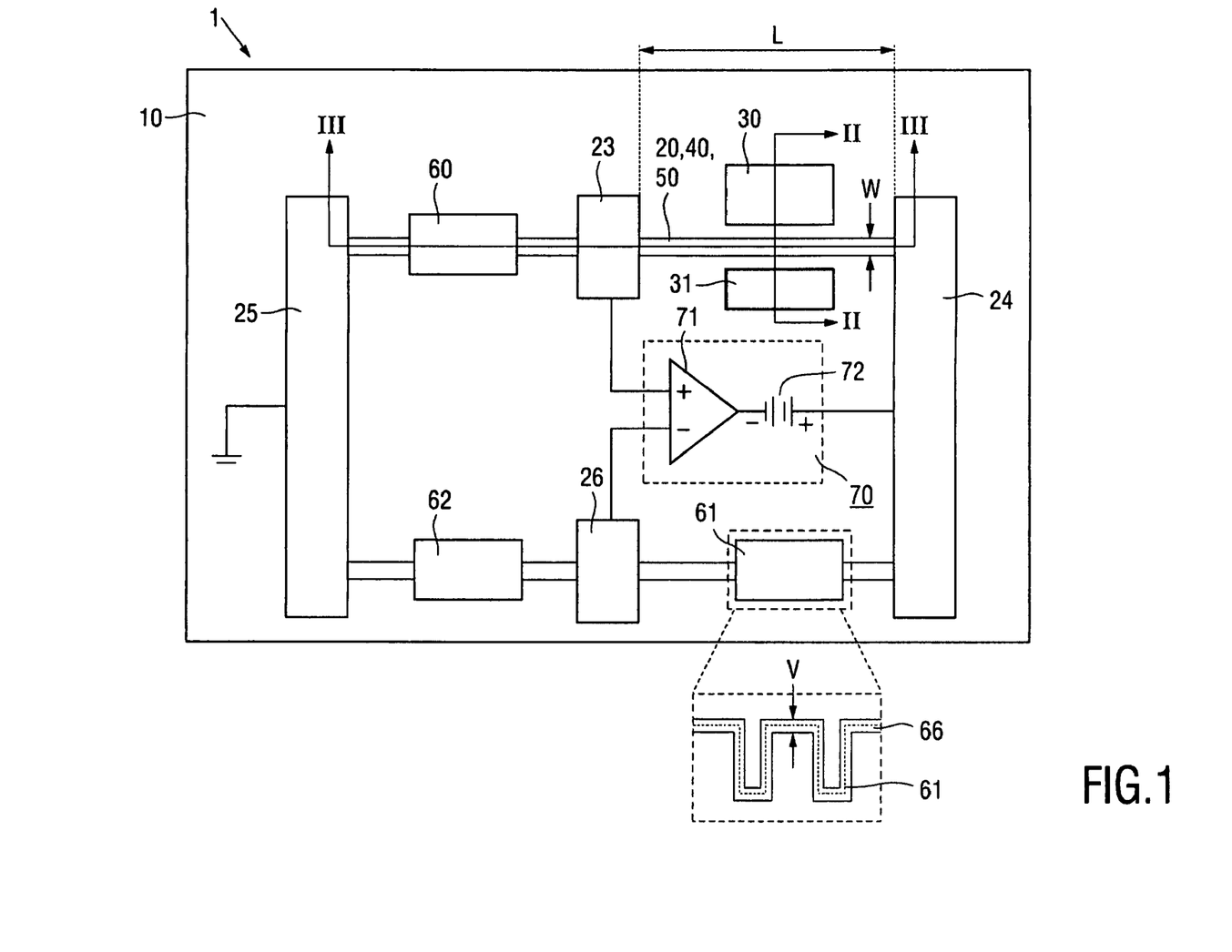
FIG. 1 is a schematic diagram.
Figure 2:
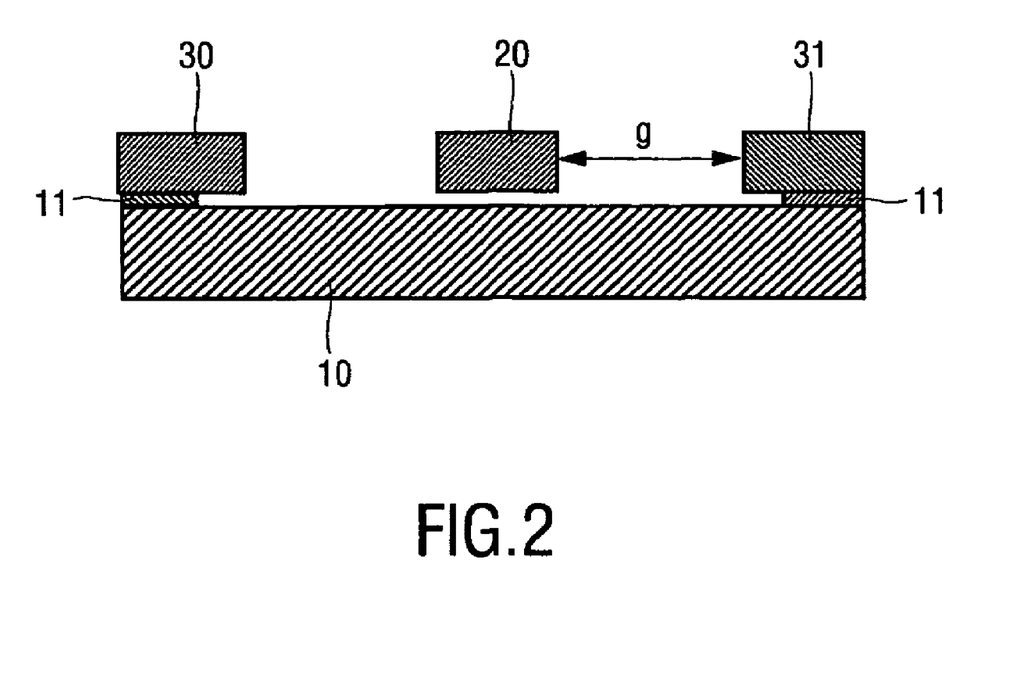
FIG. 2 is a cross section through the electromechanical transducer along line II-II of FIG. 1, FIGS. 3A-D are cross section through the electromechanical transducer along line III-III of FIG. 1 at various stages of the manufacturing process.

The electromechanical transducer 1 for transducing an electrical input signal into an electrical output signal, shown in FIG. 1 comprises a substrate 10 which is a silicon wafer. Alternatively, substrate 10 may be a gallium arsenic wafer or it may comprise any other semiconducting, metal or dielectric material. For electromechanical transducers 1 designed for operation at frequencies above 10 MHz it is advantageous to use a substrate 10 comprising a dielectric such as, e.g., glass because this reduces the loss of electromagnetic energy dissipated in the substrate 10.

The transducer 1 further comprises a resonator element 20 which is an electrically conductive beam extending in a longitudinal direction having a length 1 of μm dimensions. At its two outer ends in the longitudinal direction the resonator element 20 is attached to the substrate 10 via anchor elements 23 and 24, respectively. The anchor elements 23 and 24 are affixed to the substrate 10 as is shown in FIG. 3. The resonator element 20 is free from the substrate 10 except for the connection via the anchor elements 23 and 24.

The transducer may be manufactured, e.g., using a technique well known in the field of micro electromechanical systems (MEMS). The electromechanical transducer is shown in cross section at various stages of the manufacturing process in FIGS. 3A-D. In short, the substrate 10 is first provided with a dielectric layer 11, which may be e.g. an oxide layer, on top of which a conductive layer 90 is deposited. The conductive layer 90 may be, e.g., a n-type or p-type doped silicon layer. Out of conductive layer 90 the resonator element 20, the anchor elements 23 and 24, and the actuator 30 are formed later on. When the conductive layer 90 is composed of a semiconductor such as, e.g., silicon, it may be provided with implant regions 91 for contacting the resonator element 20 and or/the actuator 30 later on. The implant regions 91 are implanted with ions to increase the conductivity and to allow for contacting the resonator element 20 and/or the actuator 30 by metal lines later on.

Subsequently, the conductive layer 90 is covered by a another dielectric layer 92 which preferably is composed of another dielectric material such that the dielectric material of layer 11 may be etched selectively with respect to the other dielectric material of layer 92 later on. When layer 11 is composed of silicon oxide, layer 92 may be composed of silicon nitride. Layer 92 is patterned to expose implant regions 91.

On top of the dielectric layer 92 a layer 93 of conductive material is deposited and patterned to form the reference resistor 61, the first resistor 60 and the second resistor 62. Subsequently, the pre-fabricated electromechanical transducer 1 thus obtained is provided with another layer 94 of a conducing material such as, e.g., aluminum. this layer is patterned for electrically connecting the resonator element 20 via the implant regions 91 to the first resistor 60 and to the first contact area formed by anchor element 24, for electrically connecting the reference resistor 61 to the second resistor 62 and to the first contact area formed by anchor element 24, for electrically connecting the first resistor 60 and the second resistor 62, respectively, to the second contact area formed by element 25 which is substantially identical to anchor element 24.

Figure 3A:
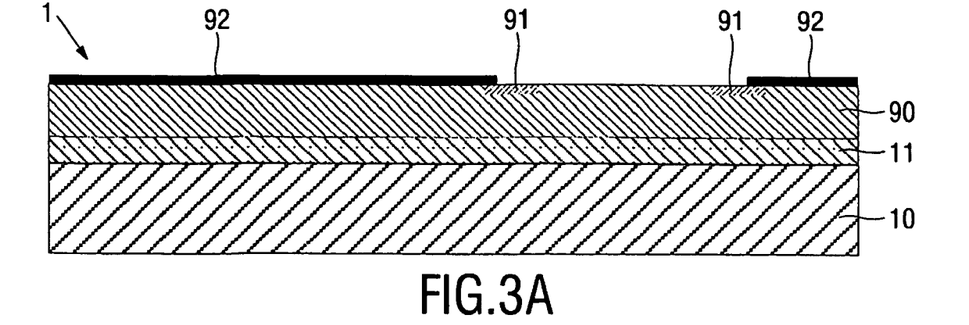
Figure 3B:
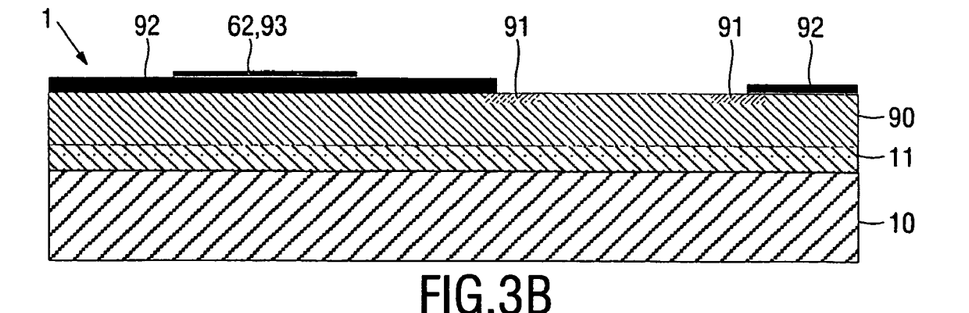
Figure 3C:
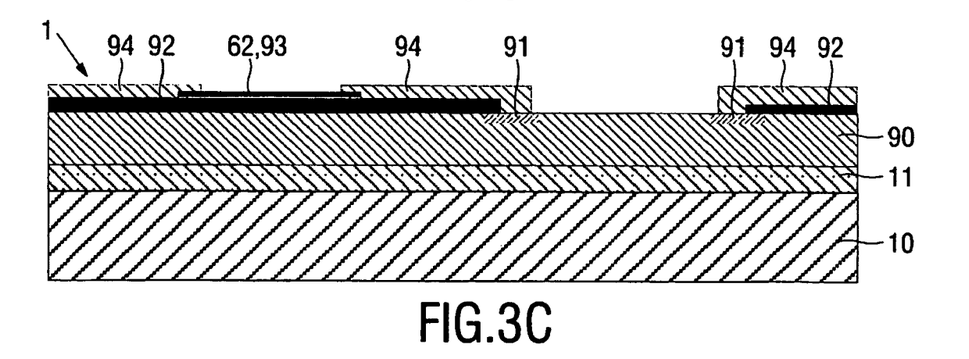
Figure 3D:
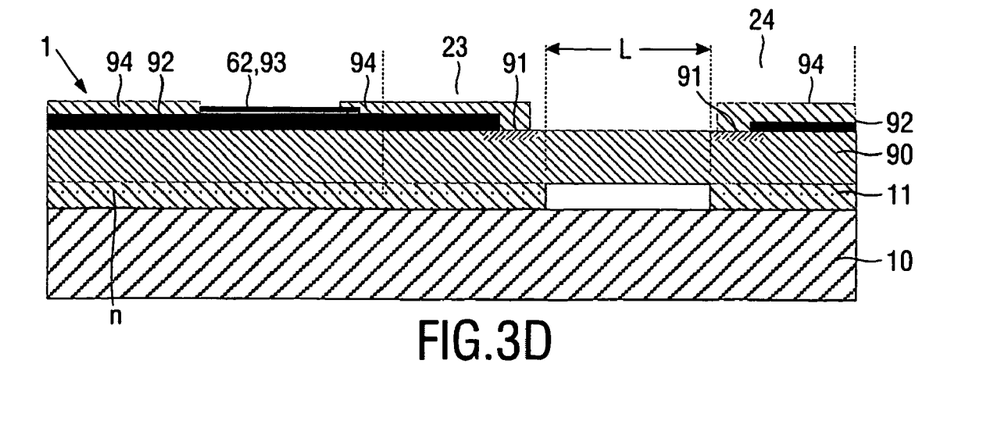

The pre-fabricated electromechanical transducer 1 thus obtained is covered by a photosensitive resist, which is patterned by, e.g., lithography. The patterned resist is then developed yielding the surface areas of the resonator element 20, the anchor elements 23 and 24, the actuator 30, shown in FIG. 1 and described below, the layer 93 and layer 94 covered by the resist while another part of the surface, which at least comprises the area between the resonator element 20 and the actuator 30 to be formed, is free of the resist. The surface partly covered by the resist is then subjected to etching which selectively removes those parts of the silicon layer which are not covered by the resist. In this way the resonator element 20, the actuator 30 and the gap between them is defined. Subsequently, the layer 11 which is exposed due to the previous etching is etched in a second etching step. This etching step removes all exposed parts of oxide layer 11 and, moreover, some of the material adjacent to these parts. As a result of the second etching step, the central part of the layer 90 is free from the substrate 10, as shown in FIG. 3D. This central part forms the resonator element 20. In other words the resonator element 20 is attached to the substrate 10 only via the anchor elements 23 and 24. As a consequence the resonator element 20 is free to move with respect to the substrate 10, i.e. it can be deformed in, e.g., a direction perpendicular to the longitudinal direction.

The method described above has the advantage that the reference resistor 61, the first resistor 60 and the second resistor 62 are integrated on the same substrate 10 as the resonator element 20.

The motions of the beam away from its equilibrium position are counteracted by an elastic force. This elastic force and the mass of the resonator element determine the resonance frequency of the resonator element. The resonance frequency includes a nominal frequency at an operating temperature and a temperature dependent frequency deviation from the nominal frequency.

The electromechanical transducer 1 comprises an actuator 30 for inducing the elastic deformation of the resonator element 20. The actuator 30 comprises an electrode with a surface facing the beam in the longitudinal direction. The actuator 30 may be provided with an electrical actuation potential difference with respect to the resonator element, the actuation potential difference being a function of the electrical input signal. The actuation potential difference comprises an AC component and a DC component, the AC component being the input signal.

The surface of the electrode and of the resonant element 20 constitute a capacitor. When an actuation potential difference is applied, they therefore exert an electrostatic force onto each other, leading to an elastic deformation of the beam. Periodically changing the electrical actuation potential difference leads to a periodical deformation of the beam. When the electrical actuation potential difference is changed with a frequency which substantially matches with an resonance frequency of the beam, the beam is brought into mechanical resonance which leads to a relatively large deformation. In other words, the elastic deformation is dependent on the electrical input signal and is resonantly enhanced when the electrical input signal comprises a signal component changing substantially with a resonance frequency of the resonator element.

The electromechanical transducer 1 further comprises an electrical output signal generating element for generating the electrical output signal which is a function of the elastic deformation. In the embodiment of FIG. 1 the electrical output signal generating element comprise another electrode 31 with a surface facing the beam in the longitudinal direction at a side opposite to the side faced by the electrode of the actuator 30. The surface of the other electrode 31 and of the resonant element 20 constitute another capacitor.

When the beam is biased with respect to the other electrode charges are induced on the other electrode 31. Due to the elastic deformation the distance, often referred to as the gap g, between the beam and the other electrode constituting the other capacitor is modulated and additional charges are induced on the other electrode 31. The other electrode 31 is part of a circuit in which the additional charges are measured in order to generate an electrical output signal. The amount of additional charges and thus the amplitude of the electrical output signal depends on the size of the gap g and therefore, on the deformation of the beam: the smaller the gap, the larger the additional charges. Therefore, the output signal may be used to capacitively measure the elastic deformation.

The electromechanical transducer 1 further comprises a sensing element 40 for providing an electrical sensing signal being a function of a temperature of the resonator element 20. The sensing element 40 comprises a sensing resistor, which has a sensing resistance including a nominal sensing resistance $R_S$ at the operating temperature $T_O$ and a temperature dependent sensing resistance deviation $dR_S(T-T_O)$ from the nominal sensing resistance. In this embodiment the temperature dependent sensing resistance deviation $dR_S$ is positive when $T-T_O>0$, i.e. the sensing resistor has a positive temperature dependence. In the embodiment of FIG. 1 the sensing resistor is constituted by the resonator element 20, i.e. the sensing resistor comprises at least a part of the resonator element 20.

The sensing resistor is included in a Wheatstone type of electric circuit, shown in FIG. 1. The Wheatstone type of electric circuit comprises a first contact area formed by anchor element 24 and a second contact area formed by element 25 which is substantially identical to anchor element 24. The second contact area 25 is electrically connected to ground potential. The first contact area is electrically connected to the second contact area via a first connection and via a second connection arranged parallel to the first connection. The first connection comprises the sensing resistor in series with a first resistor 60, the second connection comprises a reference resistor 61 in series with a second resistor 62. The sensing resistor and the first resistor 60 are electrically connected by a first electrical connector which in this embodiment is formed by the anchor element 23. The reference resistor 61 and the second resistor 62 are electrically connected by a second electrical connector which is formed by an element 26 substantially identical to anchor element 23.

The sensing resistor 40 is situated between the first contact area 24 and the first connector 23, and the reference resistor 61 is situated between the first contact area 24 and the second connector 26. At the operating temperature the reference resistor 61 has a nominal reference resistance $R_R$, the first resistor 60 has a nominal first resistance $R_1$, and the second resistor 62 has a nominal second resistance $R_2$. The ratio of the nominal sensing resistance over the nominal first resistance being equal to the ratio of the nominal reference resistance over the nominal second resistance times a scaling factor c, which is substantially equal to 1, i.e. $R_S/R_1 \approx R_R/R_2$ holds. The electrical sensing signal comprises a potential difference between the first connector 23 and the second connector 26. The potential difference and thus the electrical sensing signal is a function of the sensing resistance. The electrical sensing signal comprises a voltage drop over the sensing resistor which is compared to the voltage drop over the first resistor 60, the second resistor 62 and the reference resistor 61. At the operating temperature, the potential difference is substantially zero because $R_S/R_1 \approx R_R/R_2$ holds.

When the temperature of the resonator element 20 changes, the temperature of the sensing resistor changes as well. Due to the temperature dependent sensing resistance deviation $dR_S$ $(T-T_O)$ the sensing resistance $R_S$ changes. Then, the ratio of the actual sensing resistance over the actual first resistance is no longer equal to the ratio of the actual reference resistance over the actual second resistance. As a consequence, the potential difference is no longer substantially zero.

The electromechanical transducer 1 further comprises a heating element 50 for heating the resonator element 20 for reducing the frequency deviation to keep the resonance frequency substantially equal to the nominal frequency. The heating element 50 comprises a heating resistor which comprises at least a part of the resonator element 20. In the embodiment of FIG. 1 the resonator element 20 constitutes the heating element 50 and thus, the sensing resistor 40 constitutes the heating resistor 50 as well.

The heating element 50 is controlled by an electrical heating signal derived from the electrical sensing signal. The first contact area 24 is electrically connected to an electrical energy source 70 for providing the electrical heating signal. The electrical energy source 70 comprises an operational amplifier 71 which amplifies the potential difference between the first connector 23 and the second connector 26. The output of the operational amplifier 71 is electrically connected to the negative pole of a voltage source 72. The positive pole of the voltage source 72 is electrically connected to the first contact area 24. The voltage source 72 delivers a constant voltage $V_S$. Alternatively or in addition, the voltage source 72 may deliver an AC voltage $V_S$, which changes with a sufficiently high frequency such that the heating is effectively constant on a time scale of an oscillation of the AC voltage.

At the operating temperature the potential difference at the entrance of the operational amplifier 71 is zero, thus the negative pole of the voltage source 72 is at zero potential as well and the positive pole is at $V_S$. The current through the resistors shown in FIG. 1 is then determined by their nominal resistances and by the value of $V_S$.

When the actual temperature is lower than the operating temperature, due to the positive temperature dependence of the sensing resistor the actual resistance of the sensing resistor is smaller than the nominal sensing resistance. Therefore, the voltage drop over the sensing resistor is reduced and the potential difference dV is positive. The negative pole of voltage source 72 then has a positive potential which is equal to dV times the gain of the operational amplifier 71. The positive pole of the voltage source has a potential which is increased by the same amount with respect to the ground. This leads to an increased electrical current which leads to an increased Joule heating thereby increasing the temperature of the beam.

When the actual temperature is higher than the operating temperature, due to the positive temperature dependence of the sensing resistor the actual resistance of the sensing resistor is larger than the nominal sensing resistance. Therefore, the voltage drop over the sensing resistor is increased and the potential difference dV is negative. The negative pole of voltage source 72 then has a negative potential which again is equal to dV times the gain of the operational amplifier 71. The positive pole of the voltage source has a potential which is decreased by the same amount with respect to the ground.

Provided that the absolute value of dV times the gain is smaller than $V_S$, this leads to a decreased electrical current which leads to a decreased Joule heating thereby decreasing the temperature of the beam.

The electrical heating signal is a function of the electrical sensing signal. In one embodiment the electrical heating signal is proportional to the electrical sensing signal. Alternatively or in addition, the electrical heating signal may comprise a component, which is proportional to the electrical sensing signal integrated over a predetermined period of time, and/or another component, which is proportional to the change of the electrical sensing signal over another predetermined period of time. When the heating signal has the component and/or the other component, noise on a relatively large and on a relatively short time scale, respectively, is reduced.

In the embodiment of FIG. 1 the resonator element 20 is a beam with a width W of 2 µm, a length L of 10 µm and a height H perpendicular to the plane of FIG. 1 of 20 µm. It is made of phosphor doped silicon having a phosphor concentration of $3 \cdot 10^6$ cm$^3$. At an operating temperature the beam has a sensing resistance $R_S$=1000 Ohm. The temperature dependent sensing resistance deviation of the beam is $dR_S(T-T_O)=37.5 \cdot (T-T_O)$ Ohm.

In the embodiment of FIG. 1 the reference resistor 61, the first resistor 60 and the second resistor 62 are each composed of a layer of TiWN which has a relative temperature dependent resistance deviation smaller than, e.g., 100 parts per million (ppm) per Kelvin (K) and which is smaller than the relative temperature dependent sensing resistance deviation, i.e. the following relations hold:

$$dR_R(T-T_O)/R_R = dR_1(T-T_O)/R_1 = dR_2(T-T_O)/R_2 < dR_S(T-T_O)/R_S.$$

This implies that the relative temperature dependent first resistance deviation is substantially equal to the relative temperature dependent second resistance deviation.

Alternatively, the reference resistor 61, the first resistor 60 and the second resistor 62 are each composed of a layer of SiCrN which also has a relative temperature dependent resistance deviation smaller than, e.g., 100 ppm/K. This material has the advantage that the resistivity is higher than that of TiWN which allows for relatively compact reference resistor 61, first resistor 60 and second resistor 62.

For TiWN the relative temperature dependent resistance deviation is controlled by the nitrogen concentration in the layer of TiWN. The layer of TiWN is created by sputter deposition and the nitrogen concentration is controlled by controlling the $N_2$ concentration in the reaction chamber where the layer is created.

For SiCrN the relative temperature dependent resistance deviation is controlled by annealing the layer. Details of the creation of the SiCrN and the TiWN layer are disclosed in the article "Metal film precision resistors: Resistive metal films and a new resistor concept" by J. J. van den Broek et al., Philips Journal of Research, volume 51, issue number 3, page 429-447.

Preferably, $dR_R(T-T_O)/R_R = dR_1(T-T_O)/R_1 = dR_2(T-T_O)/R_2 \approx 0$ holds because in this case the temperature stabilization is relatively accurate.

The reference resistor 61 and the second resistor 62 are substantially identical and have a meander shape schematically depicted in the inset of FIG. 1. The actual meander may have more turns than the one depicted in FIG. 1. The length of the meander, i.e. the length of a line in the middle of the meander, indicated by reference numeral 66, is 2500 µm, the width V of the meander is 20 µm, and the height of the TiWN layer perpendicular to the plane of FIG. 1 is 50 nm. The reference resistor 61 and the second resistor 62 each have a nominal resistance of 5000 Ohm, thus the nominal reference resistance is smaller than the nominal sensing resistance: $R_R < R_S$.

The first resistor 60 also has a meander shape similar to that of the reference resistor 61 and the second resistor 62. The length of the meander of the first resistor 60 is 500 µm, the width V of the meander is 20 µm, and the height of the TiWN layer perpendicular to the plane of FIG. 1 is 50 nm. The first resistor 60 has a nominal first resistance $R_1$=1000 Ohm.

In an embodiment, the resonator element 20 is a beam of n-type doped silicon, having a doping concentration of $3 \cdot 10^{16}$ cm$^{-3}$, a height of 20, a width of 20 and a length of 200 µm, and a resistance of 7 kOhm at the operating temperature. The Q factor of the resonator element 20 is approximately $10^5$ and the temperature dependent relative change of the resonator frequency f around an operating temperature of 373 K is approximately $df/(f_0 \cdot dT)=40$ ppm/K, where $f_0$ is the resonance frequency at the operating temperature. Because the width of the resonance frequency band is inversely proportional to the quality factor Q of the resonator, the actual frequency is within the resonance frequency band provided that $df/f_0 < 1/Q$ holds. This condition is satisfied when $dT < 0.25$ K, thus the temperature of the sensing resistor which is constituted by the resonator element 20 should be stabilized within 0.25 K. Due to its composition the resonator element 20 has a TCR of 10000 ppm/K, thus the drift of the sensing resistor has to be smaller than 10000 (ppm/K)*0.25 K=2500 ppm. This condition is to be met when the temperature of the reference resistor 61, the first resistor 60 and the second resistor 62 is varied over a range of, e.g., 100 K. The TCRR should then be smaller than 2500 ppm/100 K=25 ppm/K. The TCR of the first resistor 60 and the second resistor 62 should preferably meet the same condition as the reference resistor 61.

The reference resistor 61 is composed of a 50 nm thick layer of SiCrN having a resistance of 1.3 mOhm cm and a width of 10 µm and a length of 540 µm. It has a resistance of 14 kOhm. The second resistor 62 is identical to the reference resistor 62, the first resistor 60 is composed of a 50 nm thick layer of SiCrN having a resistance of 1.3 mOhm cm and a width of 20 µm and a length of 540 µm. It has a resistance of 7 kOhm which is identical to the resistance of the resonator element 20.

Figure 4:
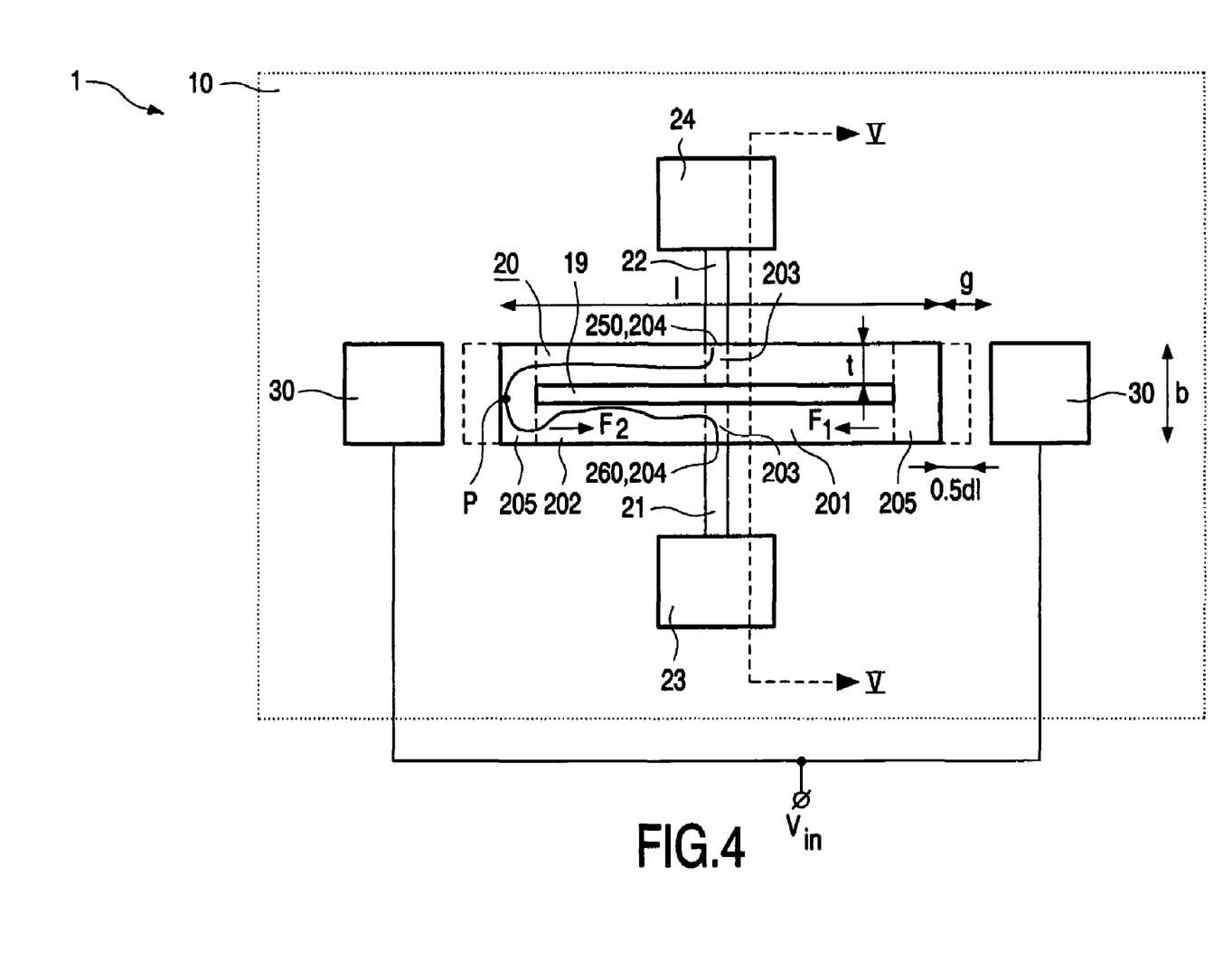
FIG. 4 is a partial top view of an embodiment of the transducer showing the resonator element, the actuator and the anchor elements only.
Figure 5A:
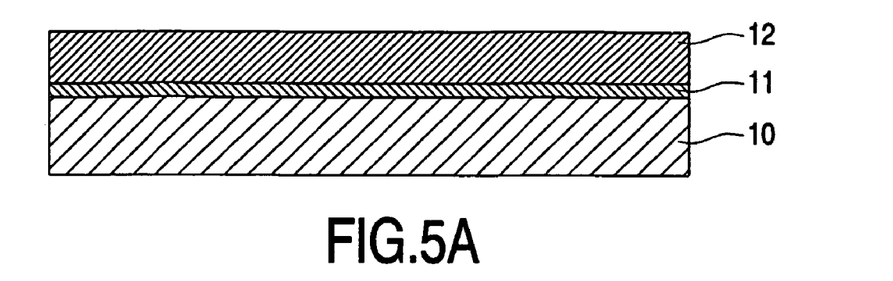
FIGS. 5A-5C are cross sections of the transducer according to V-V in FIG. 4 at various stages of the manufacturing process.
Figure 5B:
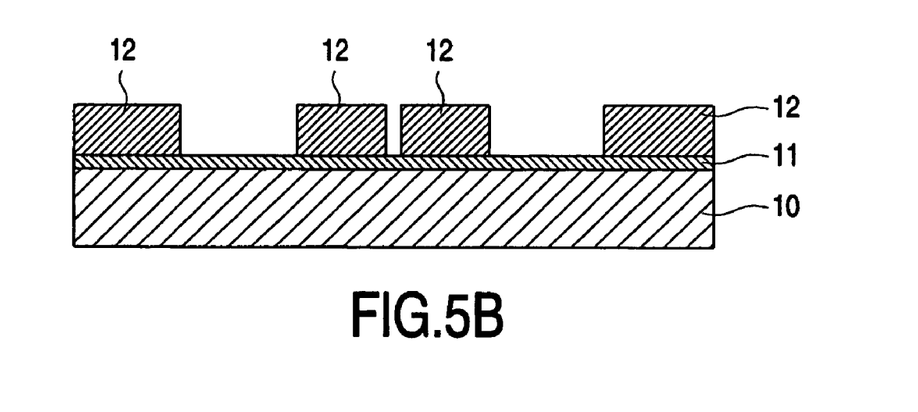
Figure 5C:
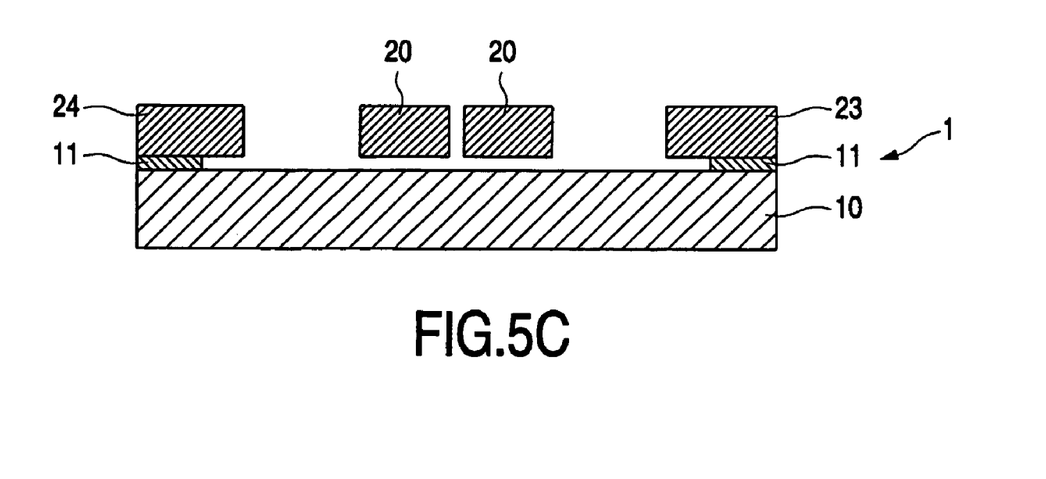

In FIG. 4 a partial top view of an embodiment of the transducer is shown with the resonator element 20, the actuator 30 and the anchor elements 24 and 25. Other parts of the transducer 1 which are identical to that shown in FIG. 1 are omitted for clarity. In this embodiment the transducer 1 comprises an electrically conductive resonator element 20 which extends in a longitudinal direction having a length 1. It is attached to the substrate 10 via support elements 21 and 22 which are connected to anchor elements 23 and 24, respectively. The anchor elements 23 and 24 are affixed to the substrate 10 as is shown in FIG. 5C. The resonator element 20 and the support elements 21 and 22 are free from the substrate 10 except for the connection via the anchor elements 23 and 24.

The transducer may be manufactured, e.g., using a technique well known in the field of micro electromechanical systems (MEMS). In short, the substrate 10 is first provided with an oxide layer 11 on top of which a silicon layer 12 is deposited, shown in FIG. 5A. The silicon layer 12 is covered by a photosensitive resist, not shown, which is patterned by, e.g., lithography. The patterned resist is then developed yielding the surface areas of the resonator element 20, the support elements 21 and 22, the anchor elements 23 and 24, and the actuator 30 shown in FIG. 4 covered by the resist while the remaining part of the surface is free of the resist. The surface partly covered by the resist is then subjected to etching which selectively removes those parts of the silicon layer 12 which are not covered by the resist. The result of the etching is shown in FIG. 5B. Subsequently, the oxide layer 11 which is exposed due to the previous etching is removed in a second etching step. This etching step removes all exposed parts of oxide layer 11 and moreover some of the oxide adjacent to these parts. As a result of the second etching step, the central parts of silicon layer 12 in FIG. 5C are free from the substrate. They form the resonator element 20. At the same etching step also the oxide layer 11 under the support elements 21 and 22 is removed such that the resonator element 20 is attached to the substrate 10 only via the anchor elements 23 and 24.

The resonator element 20 has two outer ends in the longitudinal direction. Each of the outer ends is faced by a respective electrode of the electrically conductive actuator 30. The actuator 30 is able to receive an actuation potential difference $V_{IN}$ with respect to the resonator element 20 for elastically deforming the resonator element 20. The actuation potential difference is a function of the input signal provided to the transducer 1. In addition to the input signal the actuation potential difference may further comprise, e.g., a DC component. The elastic deformation comprises a change of the length l by an amount dl shown in FIG. 4.

The resonator element 20 is part of a circuit which is able to conduct an electrical current through the resonator element 20. The circuit may be identical to that shown in and described with reference to FIG. 1.

The resonator element 20 constitutes a resistor with an ohmic resistance R which is a function of the change dl of the length l because the resonator element 20 comprises a central part 19 with open space. The resonator element 20 comprises two mutually parallel beams each of which is affixed to a support element 21 and 22, respectively. The two beams are connected with each other at the two outer ends by elements 205. The central part 19 has been created during the lithography step and the etching step described above. It prevents the current from flowing from the support element 22 to the support element 21 in a straight line. The current has to follow the conductive path formed by the resonator element 20. This conductive path extends in the longitudinal direction.

The resonator element 20 is constituted by a first part 201 having a first length in the longitudinal direction and a second part 202 having a second length in the longitudinal direction. In the embodiment shown in FIG. 4 the first length is equal to the second length and given by 0.5·l. In another embodiment, not shown, the first length is different from the second length. It may be, e.g. 0.25·l. In yet another embodiment, also not shown, the second part 202 is omitted. The elastic deformation comprises a change of the first length which is counteracted by a first elastic force $F_1$ and a change of the second length which is counteracted by a second elastic force $F_2$. Because the actuator 30 comprises two substantially identical electrodes each of which is separated from an outer end of the resonator element 20 by substantially the same gap g, the first elastic force $F_1$ and the second elastic force $F_2$ substantially compensate each other in the deformation free part 203 which is situated in the middle of the resonator element 20. The resonator element 20 is attached to the substrate 10 via the support elements 21 and 22 in the support areas 204 comprised in the deformation free part 203. In this way the flow of mechanical energy is limited and the Q factor is relatively high, leading to a relatively large signal.

The support area 204 comprises a first resonator contact 250 and a second resonator contact 260 that is electrically connected to the first resonator contact 250 by a conductive path comprised in the resonator element 20. This conductive path comprises a point P outside the deformation free part 203 and inside element 205. The resonator element 20 has an outer end in the longitudinal direction and the point P is at the outer end.

The resonator element 20 shown in FIG. 4 comprises a first material with a first electric conductivity constituting the conductive path and a second material with a second electric conductivity which is smaller than the first electric conductivity. In this embodiment the first material is silicon and the second material comprises a dielectric material which is air. The silicon may comprise crystalline silicon with a crystal orientation [110], [111] or [100].

Alternatively, the transducer 1 may be encapsulated such that the second material comprises a low pressure gas with a pressure below 1 Pa which has the advantage that the central part 19 is substantially free from any contamination which otherwise may lead to unwanted electrical short circuits. In another embodiment described below the second material comprises a dielectric which is solid. Because of the central part 19, every path from the first resonator contact 250 to the second resonator contact 260 which is free from the point P comprises the second material.

For a resonator element 20 with a length l=360 μm, a width b=8 μm and a thickness t shown in FIG. 4 of t=2.67 μm and a height h=10 μm, the eigen frequency of the beam is approximately 12 MHz.

Figure 6A:
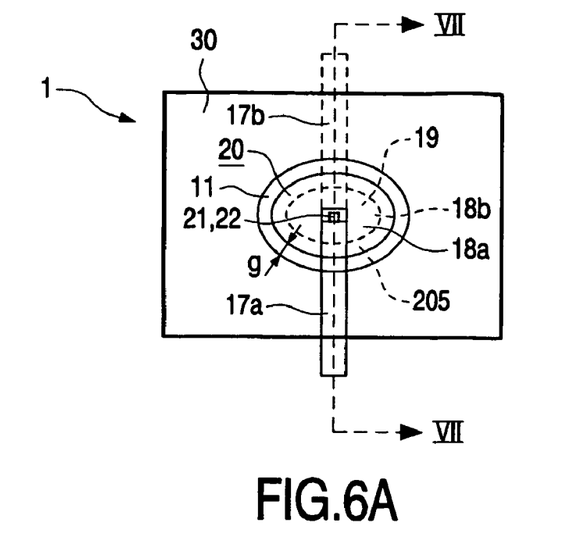
FIGS. 6A and 6B are partial top views of two other embodiments of the transducer each showing the resonator element, the actuator and the anchor elements only.
Figure 6B:
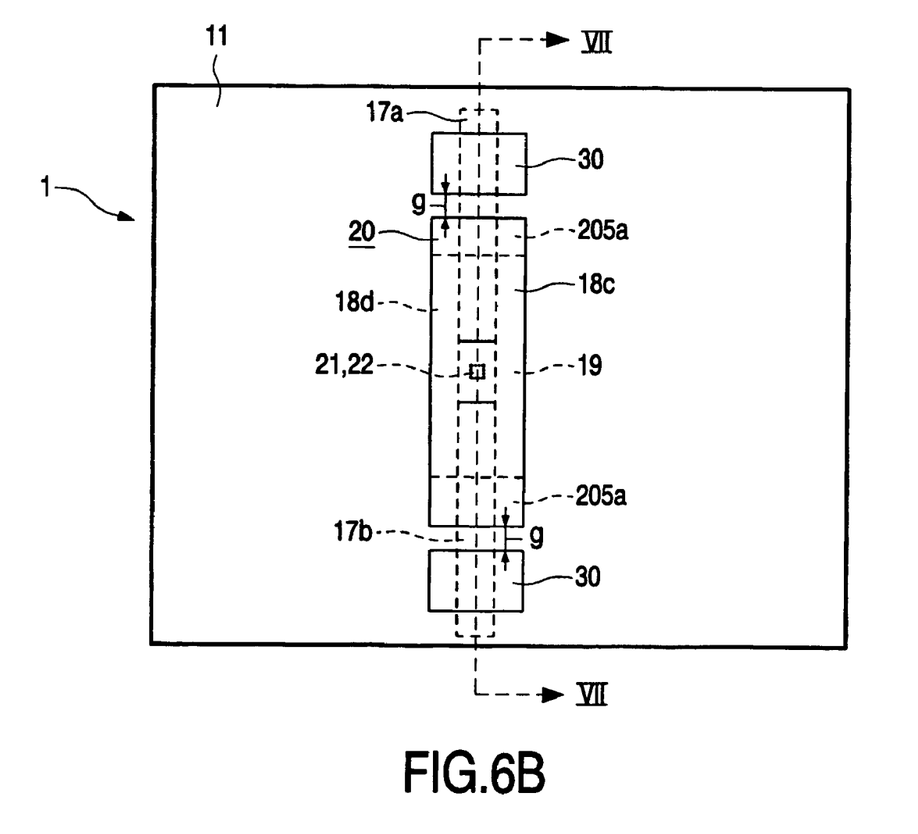

In another embodiment shown in FIGS. 6A and 6B the resonator element 20 is attached to the substrate 10 via support elements 21 and 22 in a direction perpendicular to the main surface of the substrate 10. In these embodiments the central part 19 of resonator element 20 is filled with a dielectric such as, e.g., silicon oxide or silicon nitride. For relatively small central parts 19 with dimensions in the order of μm or smaller, it is often difficult to create the open space 19 by etching without either leaving behind residuals of the etching agent or, when removing the etching agent creating a contact between the two parallel beam forming the resonator element 20. By filling the central part 19 with a dielectric during the manufacturing process described below these difficulties are largely avoided. It should be noted that FIGS. 6A and 6B show only those parts of the transducer 1 which are different from the embodiment shown in and described with reference to FIG. 1.

In the embodiment shown in FIG. 6A the resonator element 20 has a circular shape with a radius r and it is radially surrounded by the actuator 30 constituting a ring shaped gap g. The actuator 30 is able to receive an electrical actuation potential difference with respect to the resonator element 20 for elastically deforming the resonator element 20 in the radial direction, i.e. in a contour mode. It should be noted that also this type of resonator element 20 extends in a longitudinal direction having a length l: the longitudinal direction may be any radial direction and the length l in this direction is identical to the radius r. The elastic deformation comprises a change of the length dl, which is identical to the change in the radius dr. Such a resonator element is particularly suited for relatively high frequencies, e.g., above 10 MHz or even above 150 MHz. It has a relatively high Q factor which may be above 7000 or even higher.

The resonator element 20 is composed of circular shaped mutually parallel plates 18a and 18b whose outer ends are mutually electrically connected by a ring shaped element 205. Encapsulated by the circular shaped elements 18a and 18b, and by the ring shaped element 205 is a circular shaped dielectric area which constitutes the central part 19 of the resonator element 20. The upper circular shaped plate 18a and the lower circular shaped plate 18b are electrically connected to conductor 17a and 17b by support elements 21 and 22, respectively. In this way the resonator element 20 constitutes an ohmic resistor with a resistance R which is a function of the actual radius r+dr which corresponds to the length l+dl.

In an alternative embodiment shown in FIG. 6B the resonator element 20 is beam shaped. It is composed of rectangular shaped, mutually parallel plates 18c and 18d whose outer ends in the longitudinal direction are connected by rectangular elements 205a. The parts of the rectangular plates 18c and 18d which are free from the rectangular elements 205a are separated by a central part 19 which comprises silicon nitride. In contrast to the embodiment shown in FIG. 6A the central part 19 is not entirely encapsulated here. Analogous to the embodiment shown in FIG. 6A the transducer 1 further comprises conductors 17a and 17b and support elements 21 and 22 for contacting the resonator element 20 to constitute a resistor. It further comprises actuators 30 similar to those shown in FIGS. 1 and 4.

Figure 7A:
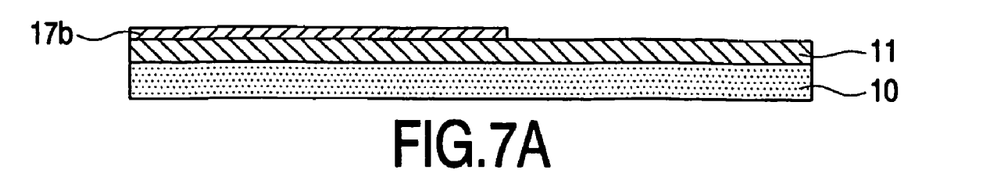
FIGS. 7A-7H are cross-sections of the transducer according to VII-VII in FIGS. 6A and 6B at various stages of the manufacturing process.

The transducer 1 shown in FIGS. 6A and 6B may be manufactured by the following method. The transducer 1 according to VII-VII in FIGS. 6A and 6B is shown at various stages of the manufacturing process in FIGS. 7A-7H. The substrate 10 is first covered by a dielectric layer 11 which may comprise, e.g., silicon nitride. On top of dielectric layer 11 conductor 17b is formed, e.g., by depositing a layer of polycrystalline silicon which is patterned by lithography and etching. The result of these steps is shown in FIG. 7A.

Figure 7B:
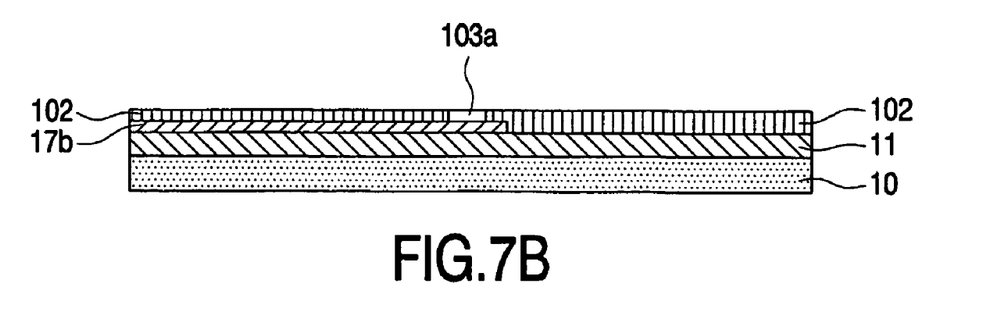
Figure 7C:
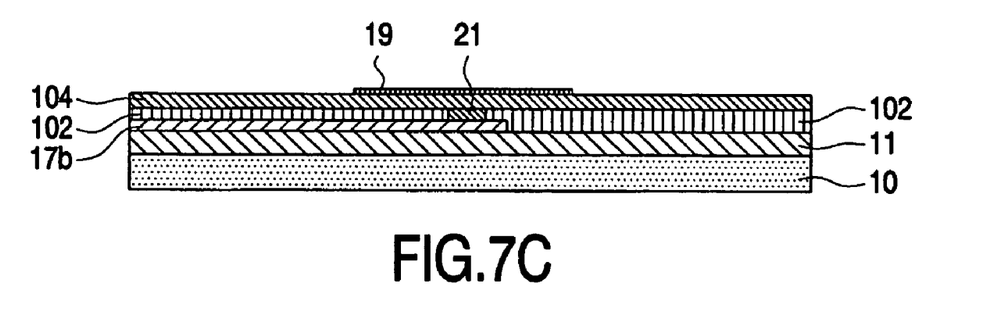
Figure 7D:
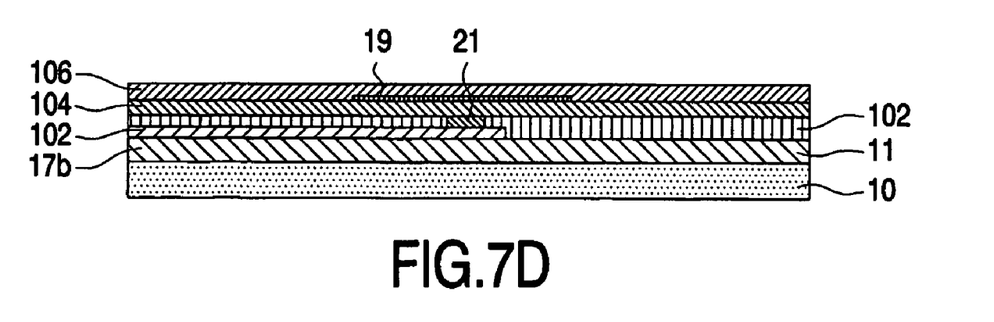

Subsequently, a further dielectric layer 102 of, e.g., silicon dioxide is deposited and an opening 103a, shown in FIG. 7B, is created in it to expose a part of conductor 17b. Then, a film 104 of polycrystalline silicon is deposited to cover dielectric layer 102 thereby filling the opening 103a and creating support element 21. On top of film 104 an additional dielectric layer is deposited of which the central part 19, shown in FIG. 7C, is formed using, e.g., lithography and etching. On top of this structure a further film 106 of polycrystalline silicon is deposited, shown in FIG. 7D.

Figure 7E:
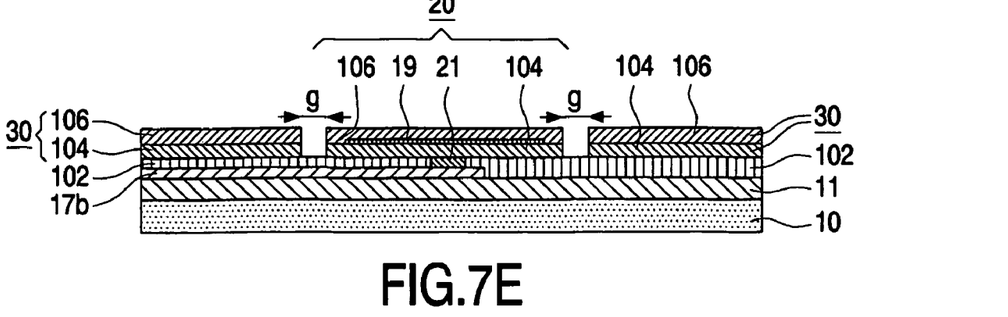
Figure 7F:
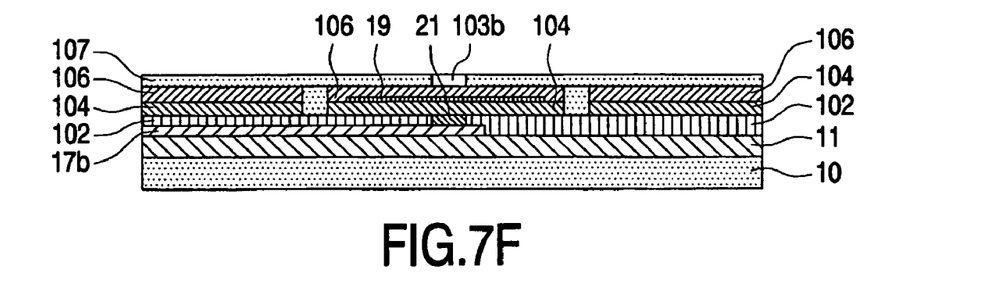
Figure 7G:
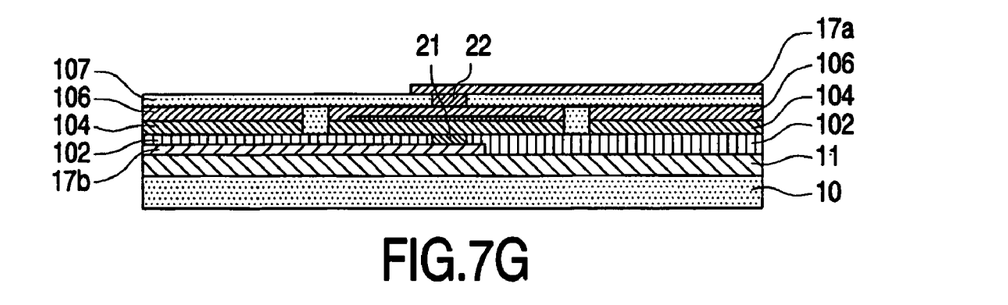
Figure 7H:
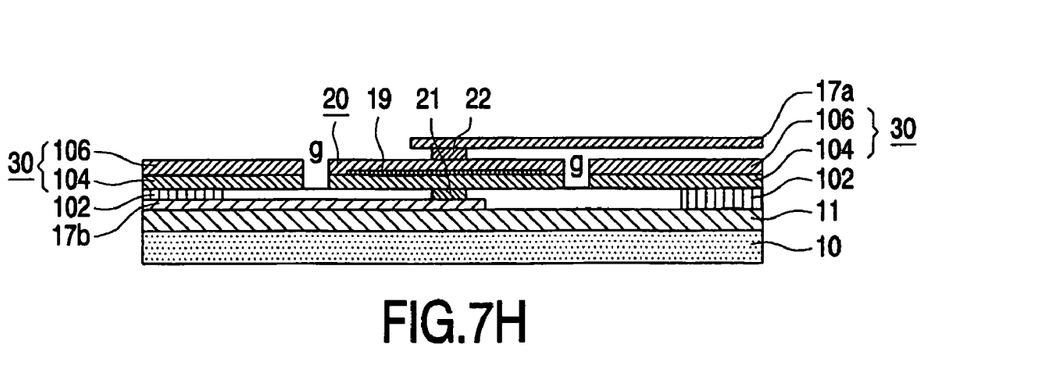

In a next step the resonator element 20 and the actuators 30 are formed from layers 104 and 106 and from the central part 19 by etching away the polycrystalline silicon in all regions free of the resonator element 20 and the actuators 30, thereby defining the gap g, shown in FIG. 7E. On top of this structure, a next dielectric layer 107 comprising silicon dioxide is deposited and an opening 103b, shown in FIG. 7F, is formed in it to expose a part of layer 106 which is part of the resonator element 20. Then, an electrically conducting film of, e.g., aluminum, tungsten, copper or polycrystalline silicon is deposited to cover dielectric layer 104 thereby filling the opening 103b and creating support element 22. From this metal film conductor 17a, shown in FIG. 7G, is then formed by lithography and etching. Finally, most parts of dielectric layers 102 and 107 are etched away, yielding the transducer 1 shown in FIGS. 6A and 6B, respectively. When manufacturing the transducer 1 shown in FIG. 6B which has a central part 19 filled with a dielectric material, it is essential that this dielectric material is different from that of dielectric layers 102 and 107 and that the latter layers can be etched selectively with respect to the dielectric material of the central part 19. For this reason the central part 19 is made of silicon nitride whereas layers 102 and 107 comprise silicon dioxide.

In summary, the electromechanical transducer 1 for transducing an electrical input signal into an electrical output signal comprises a resonator element 20 and the actuator 30 for inducing an elastic deformation of the resonator element 20. The elastic deformation is dependent on the electrical input signal and is resonantly enhanced when the electrical input signal comprises a signal component changing substantially with a resonance frequency of the resonator element. The electrical output signal is a function of the elastic deformation. The resonance frequency includes a nominal frequency at an operating temperature and a temperature dependent frequency deviation from the nominal frequency. To stabilize the resonance frequency of the resonator element the electromechanical transducer 1 further comprises a sensing element 40 for providing an electrical sensing signal, which is a function of a temperature of the resonator element 20, and a heating element 50 for heating the resonator element to reduce the temperature dependent frequency deviation to keep the resonance frequency substantially equal to the nominal frequency. The heating element 50 is controlled by an electrical heating signal derived from the electrical sensing signal.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of other elements or steps than those listed in a claim. The word "a" or "an" preceding an element does not exclude the presence of a plurality of such elements.

The invention claimed is:

1. An electromechanical transducer for transducing an electrical input signal into an electrical output signal, the electromechanical transducer comprising:

a resonator element, an actuator for inducing an elastic deformation of the resonator element, the elastic deformation being dependent on the electrical input signal and being resonantly enhanced when the electrical input signal comprises a signal component changing substantially with a resonance frequency of the resonator element, the electrical output signal being a function of the elastic deformation, the resonance frequency including a nominal frequency at an operating temperature and a temperature dependent frequency deviation from the nominal frequency, a sensing element for providing an electrical sensing signal, the electrical sensing signal being a function of a temperature of the resonator element, and a heating element for heating the resonator element for reducing the temperature dependent frequency deviation to keep the resonance frequency substantially equal to the nominal frequency, the heating element being controlled by an electrical heating signal derived from the electrical sensing signal, and the heating element including at least a part of the sensing element.

2. An electromechanical transducer as claimed in claim 1, wherein the heating element includes a heating resistor, the heating resistor including at least a part of the resonator element.

3. An electromechanical transducer as claimed in claim 1, wherein the sensing element includes a sensing resistor having a sensing resistance that has a positive temperature dependence, the sensing resistance including a nominal sensing resistance at the operating temperature and a temperature dependent sensing resistance deviation from the nominal sensing resistance, and wherein the electrical sensing signal is a function of the sensing resistance.

4. An electromechanical transducer as claimed in claim 3, wherein the sensing resistor includes at least a part of the resonator element.

5. An electrical device for receiving and/or transmitting an electrical information signal, comprising an electromechanical transducer as claimed in claim 1, wherein the electrical information signal is a function of the electrical input signal and/or the electrical output signal.

6. An electromechanical transducer as claimed in claim 1, further comprising:
   a first resistor connected in series with the sensing element, the first resistor and the sensing element forming a first connection; and
   a reference resistor connected in series with a second resistor, the reference resistor and the second resistor forming a second connection that is arranged in parallel with the first connection.

7. An electromechanical transducer as claimed in claim 6, further comprising a first contact area and a second contact area that are electrically connected to each other via the first connection and via the second connection, and wherein the first connection includes a first electrical connector connected between the sensing element and the first resistor and the second connection includes a second electrical connector connected between the reference resistor and the second resistor.

8. An electromechanical transducer as claimed in claim 7, further comprising:
   an operational amplifier configured to amplify a potential difference between the first connector and the second connector; and
   a voltage source connected to an output of the operational amplifier and to the first contact area.

9. An electromechanical transducer for transducing an electrical input signal into an electrical output signal, the electromechanical transducer comprising:
   a resonator element;
   an actuator for inducing an elastic deformation of the resonator element, the elastic deformation being dependent on the electrical input signal and being resonantly enhanced when the electrical input signal comprises a signal component changing substantially with a resonance frequency of the resonator element, the electrical output signal being a function of the elastic deformation, the resonance frequency including a nominal frequency at an operating temperature and a temperature dependent frequency deviation from the nominal frequency;
   a sensing element for providing an electrical sensing signal, the electrical sensing signal being a function of a temperature of the resonator element; and
   a heating element for heating the resonator element for reducing the temperature dependent frequency deviation to keep the resonance frequency substantially equal to the nominal frequency, the heating element being controlled by an electrical heating signal derived from the electrical sensing signal, wherein the sensing element includes the heating element and/or the heating element includes the sensing element.

10. An electromechanical transducer as claimed in claim 9, further comprising:
    a first resistor connected in series with the sensing element, the first resistor and the sensing element forming a first connection; and
    a reference resistor connected in series with a second resistor, the reference resistor and the second resistor forming a second connection that is arranged in parallel with the first connection.

11. An electromechanical transducer as claimed in claim 10, further comprising a first contact area and a second contact area that are electrically connected to each other via the first connection and via the second connection, and wherein the first connection includes a first electrical connector connected between the sensing element and the first resistor and the second connection includes a second electrical connector connected between the reference resistor and the second resistor.

12. An electromechanical transducer as claimed in claim 11, further comprising:
    an operational amplifier configured to amplify a potential difference between the first connector and the second connector; and
    a voltage source connected to an output of the operational amplifier and to the first contact area.

13. An electromechanical transducer for transducing an electrical input signal into an electrical output signal, the electromechanical transducer comprising:
    a resonator element;
    an actuator for inducing an elastic deformation of the resonator element, the elastic deformation being dependent on the electrical input signal and being resonantly enhanced when the electrical input signal comprises a signal component changing substantially with a resonance frequency of the resonator element, the electrical output signal being a function of the elastic deformation, the resonance frequency including a nominal frequency at an operating temperature and a temperature dependent frequency deviation from the nominal frequency;
    a Wheatstone type of electric circuit that includes
        a sensing resistor for providing an electrical sensing signal, the electrical sensing signal being a function of a temperature of the resonator element,
        a first contact area and a second contact area, the first contact area being electrically connected to the second contact area via a first connection and via a second connection arranged parallel to the first connection, the first connection including the sensing resistor in series with a first resistor, the second connection including a reference resistor in series with a second resistor, the sensing resistor and the first resistor being connected by a first electrical connector, the reference resistor and the second resistor being connected by a second electrical connector, and the electrical sensing signal including a potential difference between the first connector and the second connector; and
    a heating element for heating the resonator element for reducing the temperature dependent frequency deviation to keep the resonance frequency substantially equal to the nominal frequency, the heating element being controlled by an electrical heating signal derived from the electrical sensing signal.

14. An electromechanical transducer as claimed in claim 13, wherein the reference resistor has a reference resistance including a nominal reference resistance at the operating temperature and a temperature dependent reference resistance deviation from the nominal reference resistance, and wherein the sensing resistor has a sensing resistance including a nominal sensing resistance at the operating temperature and a temperature dependent sensing resistance deviation from the nominal sensing resistance, with a relative temperature dependent reference resistance deviation being smaller than a relative temperature dependent sensing resistance deviation.

15. An electromechanical transducer as claimed in claim 13, wherein the first resistor has a first resistance including a nominal first resistance at the operating temperature and a temperature dependent first resistance deviation from the nominal first resistance, and wherein the second resistor has a second resistance including a nominal second resistance at the operating temperature and a temperature dependent second resistance deviation from the nominal second resistance, with a relative temperature dependent first resistance deviation being substantially equal to a relative temperature dependent second resistance deviation.

16. An electromechanical transducer as claimed in claim 13, wherein the sensing resistor is situated between the first contact area and the first connector, and the reference resistor is situated between the first contact area and the second connector, and wherein at the operating temperature the sensing resistor has a nominal sensing resistance, the reference resistor has a nominal reference resistance, the first resistor has a nominal first resistance, and the second resistor has a nominal second resistance, with the ratio of the nominal sensing resistance over the nominal first resistance being equal to the ratio of the nominal reference resistance over the nominal second resistance times a scaling factor, the scaling factor being substantially equal to 1.

17. An electromechanical transducer as claimed in claim 16, wherein the heating element includes a heating resistor, the sensing resistor constituting the heating resistor, the second contact area being electrically connected to a ground potential, and the first contact area being electrically connected to an electrical energy source for providing the electrical heating signal.

18. An electromechanical transducer as claimed in claim 17, wherein the nominal reference resistance is larger than the nominal sensing resistance.

19. An electromechanical transducer for transducing an electrical input signal into an electrical output signal, the electromechanical transducer comprising:
   a resonator element that includes a first part having a first length in the longitudinal direction, a second part having a second length in the longitudinal direction, and a deformation free part having a support area that attaches the resonator element to a substrate;
   an actuator for inducing an elastic deformation of the resonator element, the elastic deformation including a change of the first length which is counteracted by a first elastic force, and a change of the second length which is counteracted by a second elastic force, the first elastic force and the second elastic force substantially compensating each other in the deformation free part and the elastic deformation being dependent on the electrical input signal and being resonantly enhanced when the electrical input signal comprises a signal component changing substantially with a resonance frequency of the resonator element, the electrical output signal being a function of the elastic deformation, the resonance frequency including a nominal frequency at an operating temperature and a temperature dependent frequency deviation from the nominal frequency;
   a sensing element for providing an electrical sensing signal, the electrical sensing signal being a function of a temperature of the resonator element; and
   a heating element for heating the resonator element for reducing the temperature dependent frequency deviation to keep the resonance frequency substantially equal to the nominal frequency, the heating element being controlled by an electrical heating signal derived from the electrical sensing signal.

20. A transducer as claimed in claim 19, wherein the support area includes a first resonator contact and a second resonator contact that is electrically connected to the first resonator contact by a conductive path comprised in the resonator element, the conductive path including a point outside the deformation free part.

21. A transducer as claimed in claim 20, wherein the resonator element has an outer end in the longitudinal direction, the point being at the outer end.

22. A transducer as claimed in claim 20, wherein the resonator element includes a first material with a first electric conductivity constituting the conductive path, and a second material with a second electric conductivity which is smaller than the first electric conductivity, and wherein every path from the first resonator contact to the second resonator contact which is free from the point includes the second material.

23. A transducer as claimed in claim 22, wherein the second material includes a dielectric material.

* * * * *